United States Patent [19]
Tran

[11] Patent Number: 5,944,900
[45] Date of Patent: Aug. 31, 1999

[54] PROTECTIVE GAS SHIELD FOR CHEMICAL VAPOR DEPOSITION APPARATUS

[75] Inventor: Don Van Tran, Hsinchu, Taiwan

[73] Assignee: Watkins Johnson Company, Palo Alto, Calif.

[21] Appl. No.: 08/976,928

[22] Filed: Nov. 24, 1997

Related U.S. Application Data

[63] Continuation of application No. 08/800,106, Feb. 13, 1997.
[51] Int. Cl.$^6$ .................................................. C23C 16/00
[52] U.S. Cl. .............................................................. 118/715
[58] Field of Search ............................................. 118/715

[56] References Cited

U.S. PATENT DOCUMENTS

| | | | |
|---|---|---|---|
| 4,834,020 | 5/1989 | Bartholomew et al. | 118/719 |
| 5,122,391 | 6/1992 | Mayer | 427/126.3 |
| 5,136,975 | 8/1992 | Bartholomew et al. | 118/715 |

OTHER PUBLICATIONS

WJ–TEOS999 APCVD System.

*Primary Examiner*—Richard Bueker
*Attorney, Agent, or Firm*—Flehr Hohbach Test Albritton & Herbert LLP

[57] ABSTRACT

A shield assembly for protecting an exposed surface of an injector. The shield assembly includes a shield body having a front and back walls and at least one plenum therebetween, and at least one conduit coupled for delivering a gaseous substance to the plenum. The front wall includes a plurality of apertures for removing the gaseous substance from the plenum. The apertures are configured to provide a substantially uniform distribution of the gaseous substance across an exterior region of the front wall. At least one support member extends between the front and back walls, and is positioned to transfer forces from the front wall to the back wall to thereby reinforce the front wall against collapse.

16 Claims, 3 Drawing Sheets

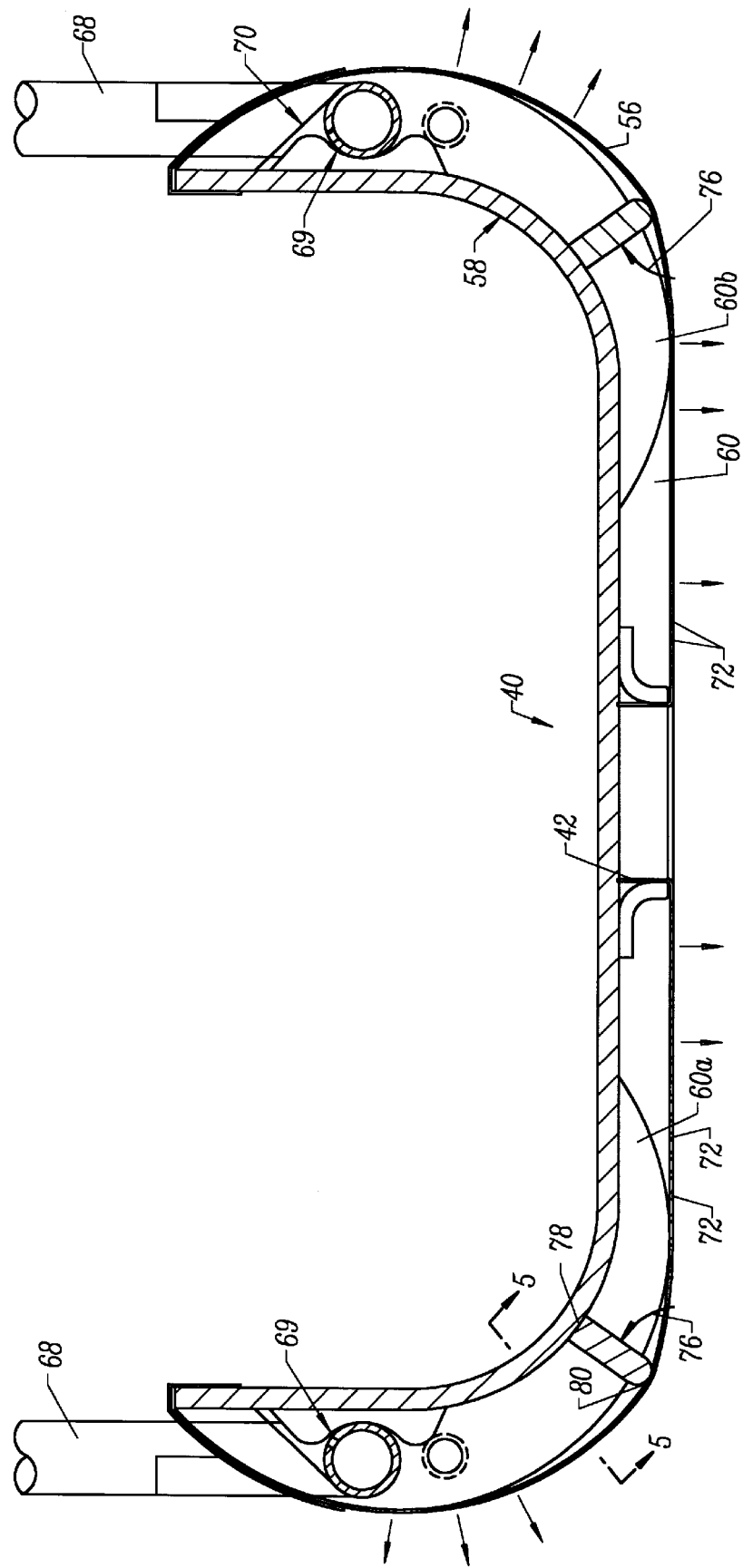

PROTECTIVE GAS SHIELD FOR CHEMICAL VAPOR DEPOSITION APPARATUS

This is a File Wrapper Continuation of application Ser. No. 08/800,106, filed Feb. 13, 1997.

BRIEF DESCRIPTION OF THE INVENTION

The present invention relates in general to a chemical vapor deposition apparatus and, more particularly, to a nitrogen shield for use during chemical vapor deposition processing.

BACKGROUND OF THE INVENTION

Chemical vapor deposition (CVD) systems are used to form a thin, uniform layer or film on a substrate such as a semiconductor wafer. During CVD processing, the substrate is exposed to one or more chemical vapors such as silane, phosphane, diborane and the like, and gaseous substances such as oxygen. The gases mix and interact with the other gases and/or the surface of the substrate to produce the desired film. The desired reactions generally occur at elevated temperatures, for example 300°–500°, with the substrate and chamber being heated to the appropriate temperature for a selected process. In many applications including semiconductor processing, film characteristics such as purity and thickness uniformity must meet high quality standards. The substrate is positioned in a clean, isolated reaction chamber to obtain high quality films. The CVD systems typically employ injectors which deliver the gaseous substances directly to the surface of the substrate. An exhaust system removes waste products such as unreacted gases and powders formed during the reaction from the reaction chamber. The reaction chamber must be periodically cleaned to remove films which are deposited on the exposed surfaces of the chamber over time, eliminating sources of particulate contamination which may become embedded in the film.

The injection ports are typically positioned less than one inch from the surface of the substrate, for example ⅛ inch to ½ inch. With this limited clearance between the injector and the substrate surface, the surfaces of the injector will become coated with the material produced during the reactions. To reduce the amount of build-up in this area, some CVD systems include shields which are positioned in front of the injectors and exhaust port. An inert gas such as nitrogen is delivered through a perforated screen to slow the rate at which materials accumulate on shield. The high temperatures in the reaction chamber create thermal stresses in the perforated screen which may cause the screen to buckle after a period of time. The buckling disrupts the uniform flow of nitrogen through the screen, leaving portions of the screen unprotected against the accumulation of deposition materials. The ability of the screen to deliver nitrogen to the reaction chamber is further reduced as the screen becomes coated with deposition materials, requiring removal and cleaning or replacement of the shield. Thus, the collapsed walls shorten the useful life of the shield. A protective gas shield for CVD systems which will withstand the high temperatures within the reaction chamber is desirable.

OBJECTS AND SUMMARY OF THE INVENTION

It is a primary object of the present invention to provide a shield assembly for protecting the exposed surfaces of a gas injector used in CVD processing.

It is a further object of the present invention to provide a shield assembly which efficiently delivers an inert gas to the surface of the shield assembly during extended use of the shield assembly.

It is another object of the present invention to provide a shield assembly which will withstand the high temperatures of the chemical reactions occurring within the chamber.

A more general object of the present invention is to provide a shield assembly which has a prolonged useful life, reducing the maintenance costs and maximizing the operational time of the CVD system, and which may be economically and efficiently manufactured and maintained.

In summary, this invention provides a durable protective shield which may be used in CVD systems to minimize the accumulation of materials on the surfaces of the injectors and the exhaust port. The shield assembly includes a shield body which is positionable proximate the surface of the injector surrounding the injection ports. The shield body has a back wall, a front wall and at least one plenum between the front and back walls. The front wall is formed with a plurality of apertures for the flow of a gaseous substance from the plenum to the reaction chamber. The apertures are distributed so that the exterior of the front wall will be covered with a substantially uniform distribution of the gaseous substance. One or more conduits supplies the plenum with a gaseous substance. At least one support member extends between said front wall and said back wall, and is positioned to transfer forces from the front wall to the back wall to thereby reinforce the front wall against collapse.

Additional objects and features of the invention will be more readily apparent from the following detailed description and appended claims when taken in conjunction with the drawings.

BRIEF DESCRIPTION OF THE DRAWINGS

FIG. 4 is a cross sectional view taken substantially along line 4—4 of FIG. 2.

DETAILED DESCRIPTION OF THE INVENTION

Figure 1:
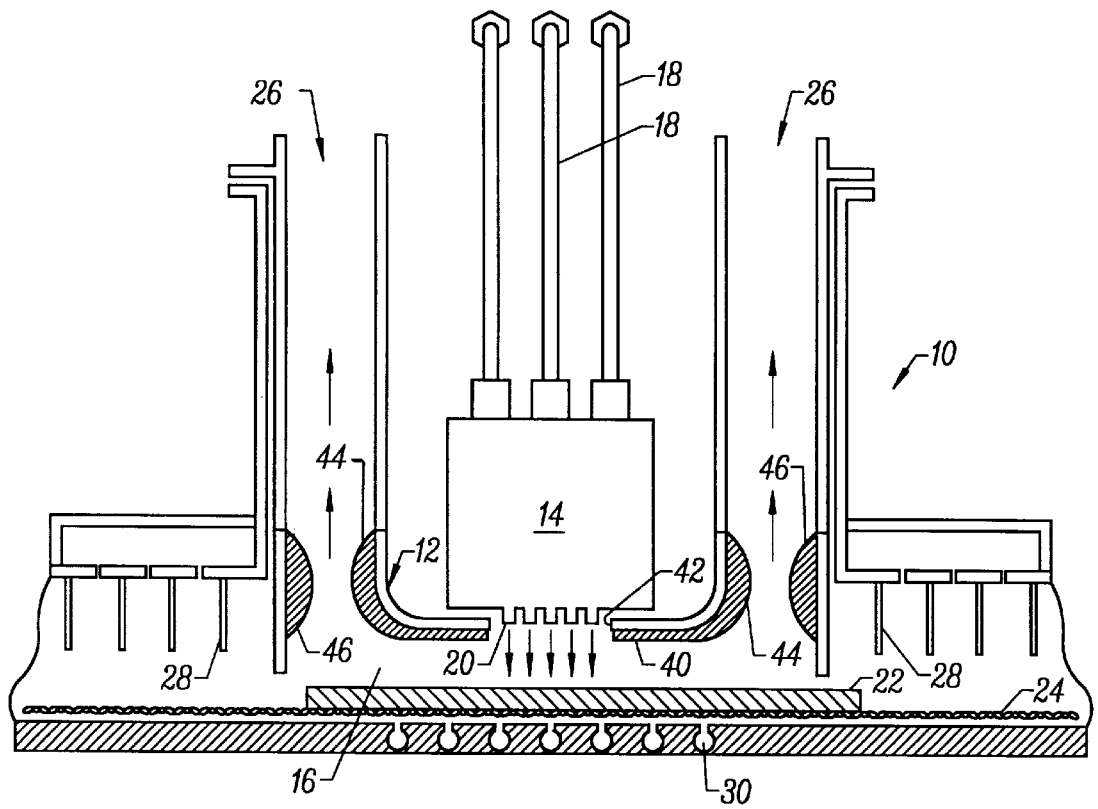
FIG. 1 is a schematic view of a CVD processing system with a protective shield in accordance with the present invention.

Reference will now be made in detail to the preferred embodiment of the invention, which is illustrated in the accompanying figures. Turning now to the drawings, wherein like components are designated by like reference numerals throughout the various figures, attention is directed to FIG. 1.

FIG. 1 schematically illustrates a section of a CVD processing system 10 which includes a protective shield assembly 12 constructed in accordance with this invention. As is known in the art, a CVD system typically includes an injector 14 for injecting chemical reagents and other gaseous substances into a chamber, generally designated 16. Conduits 18 deliver the gaseous substances to the injector 14, which transports the gases through separate flow paths to one of the injection ports 20. Although not shown, each port 20 extends lengthwise along the longitudinal axis of the injector 14 to deliver the gaseous substance in a sheet-like flow to the reaction chamber 16. As a semiconductor wafer 22 or other substrate is transported through the chamber 16 by a conveyor 24, the injected substances react with each other and/or with the upper surface of the wafer 22 to form a thin, uniform layer or film. The actual reagents used in the CVD process depends in part upon the type and quality of film desired.

In one application of the processing system 10, the inner port 20 is coupled via injector 14 and one conduit 18 to a silicon source reactant such as silicon, silane or disilane, nitrogen, and if desired a dopant source reactant such as TMP, TMB, phosphine and/or diborane. Oxygen or a combination of oxygen and ozone and nitrogen is delivered through another conduit 18 and the injector to the outer ports 20. A stream of pure nitrogen travels through another conduit 18 to the intermediate ports 20 to separate the silicon source reactant from the oxygen mixture until the gases approach the wafer surface. Deposition waste products including unreacted gas are expelled through exhaust passageways 26 which are coupled to a suitable exhaust system (not shown). Curtains 28 substantially isolate the chamber 16 from areas of the CVD assembly upstream and downstream of chamber 16. The chamber 16 and wafer 22 are retained at the desired reaction temperature by heating elements 30.

As is shown schematically in FIG. 1, protective shield assembly 12 is positioned in front of the exposed surface of the injector 14 and the inlets of the exhaust passageways 26. The shield separates the injector and exhaust passageways from the reactions occurring within the chamber 16, preventing the deposition of reaction by-products and other contaminants on the surfaces of the injector and exhaust passageways. The shield assembly 12 also inhibits the accumulation of such materials on the surface of the shield so that most of the by-products are expelled from the chamber 16 through the exhaust system.

Turning to FIGS. 2–5, the protective shield assembly 12 of this invention will be described in greater detail. Shield assembly 12 generally includes a shield body 40 which covers the exposed surface of the injector 14 around the injection ports 20. The reactants injected by ports 20 flow through a slot 42 formed in the shield body 40. The longitudinally extending slot 42 is of a shape and size relative to the ports 20 to minimize or eliminate any interference of the shield body 40 with the gas flow. A pair of upturned edges 44 spaced outwardly of the slot 42 extend around to the sides of the injector 14, providing the shield body 40 with a generally u-shaped configuration. Two secondary shields 46 are spaced outwardly of the upturned edges 44, with the gap between each shield 46 and the associated one of the upturned edges 44 defining an inlet which leads to the exhaust passageway 26. Preferably, the secondary shields 46 are coupled to the shield body 40 using suitable means such as a bracket 48 and fasteners 50. Coupling the secondary shields 46 to the shield body 40 is of particular advantage in that it simplifies the installation and removal of the protective shield assembly 12 in the reaction chamber 16, although secondary shields 46 which are separate from the shield body 40 are within the scope of this invention.

Figure 2:
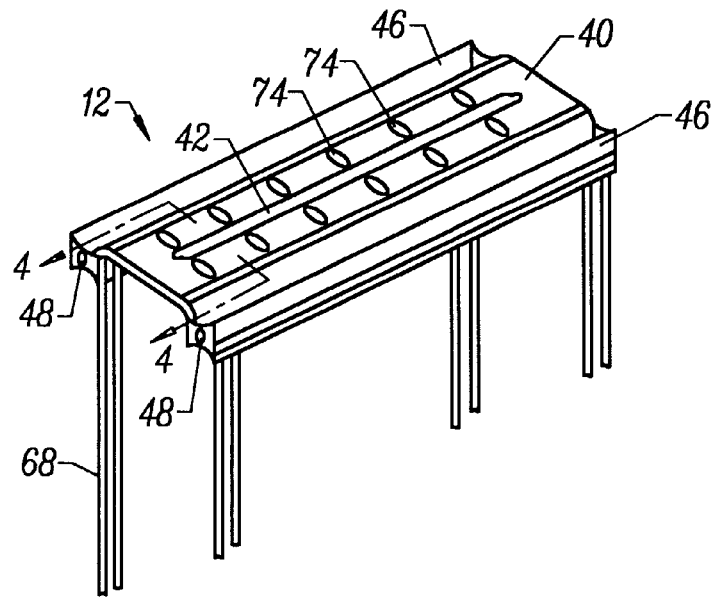
FIG. 2 is a bottom perspective view of the protective shield in of FIG. 1.
Figure 3:
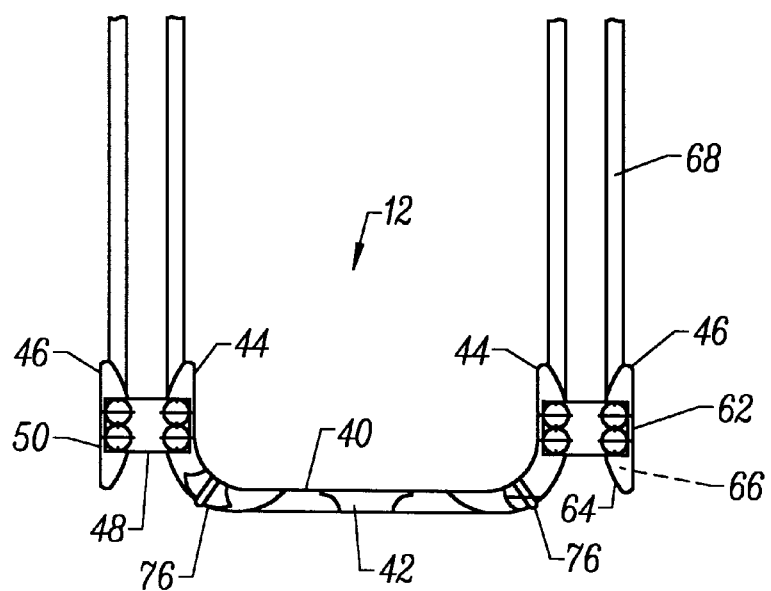
FIG. 3 is an end view of the protective shield of FIG. 1.

As is shown particularly in FIGS. 2–4, shield body 40 includes spaced front and back walls 56 and 58 which substantially define an inner plenum 60. In this embodiment, the elongate slot 42 essentially divides the plenum 60 into two regions 60a and 60b. Secondary shields 46 also include a back wall 62, front wall 64 and inner plenum 66 (FIG. 3). Conduits 68 having a plurality of holes 69 (FIG. 4) formed therein supply plenums 60 and 66 with a gaseous substance as for example an inert gas such as nitrogen. Preferably, each of the plenum regions 60a and 60b of the shield body 40 and plenum 66 of the secondary shields 46 is coupled to one or more conduits 68 to efficiently provide an optimum distribution of gas throughout the plenums 60 and 66. In this modification, shield assembly 12 includes eight conduits 68, one positioned at each of the opposite ends of the two plenum regions 60a and 60b and the plenums 66 of the secondary shields. However, it is to be understood that the number of conduits may be increased or decreased as desired. Although not shown, the conduits may be coupled to a common gas source or, if desired, more than one gas source may be employed. Baffles 70 are disposed in the plenum regions 60a and 60b of shield body 40 and the plenum 66 of shields 46 direct the flow of gas through the plenums.

The front walls 56 and 64 are preferably formed as a screen having a plurality of apertures 72 for the flow of gaseous substances from the plenums 60 and 66. The gaseous substance collects adjacent the outer surface of the front wall and forms a barrier which prevents reactants and reaction by-products from being deposited on the exposed surfaces of the shield body 40 and secondary shields 46. As is shown schematically in FIG. 1, in this embodiment gaseous barriers extends across the shield body 40 from the injection ports 18 to the upturned edges 44 as well as across both of the secondary shields 46. Preferably, the apertures 72 are distributed and sized so that the exterior of the front walls 56 and 64 will be substantially covered by the gaseous substance.

Using a gaseous substance to isolate the surfaces of the shield body 40 and secondary shields 46 minimizes the accumulation of unwanted material on the shield assembly 12, removing a source of potential contaminants from the reaction chamber 16. Maintaining a uniform distribution of the gaseous substance across the front walls 56 and 64 of the shield body and secondary shields is needed to ensure effectiveness of the shield assembly 12. As is shown particularly in FIG. 4, the front wall 56 is a perforated screen which generally consists of a lattice framework around the apertures 72. Embossed indentations 74 reduce stresses in the front wall 56. However, the screen may be susceptible to buckling after being exposed to the operating temperatures of the reaction chamber 16 over an extended period of time. Buckling of the front wall 56 interferes with the flow of nitrogen through the wall, reducing the effectiveness of the gas barrier in isolating the front wall from the excess materials and reaction by-products. The CVD processing must be interrupted and the shield assembly 12 repaired or replaced.

Figure 5:
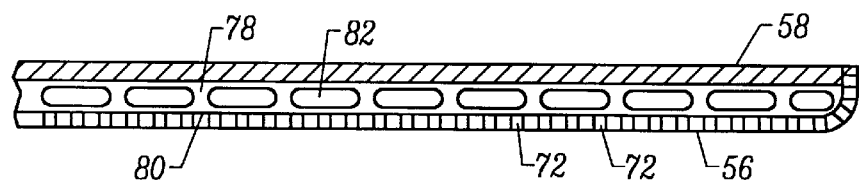
FIG. 5 is a cross sectional view, partially broken away, taken substantially along line 5—5 of FIG. 4.

The shield assembly 12 of the present invention includes means for supporting the front wall 56 against buckling. As is shown in FIGS. 3–5, shield assembly 12 includes a pair of support members 76 extending between the front and back walls 56 and 58 of the shield body. The support members 76 transfer thermal stresses from the lattice framework of the front wall 56 to the back wall 58. In this embodiment, support members 76 include a first edge 78 mounted to the back wall 58 using suitable means such as welding, soldering, threaded fasteners, bolts, and the like. A second edge 80 is in contact with the front wall 56, with the support members 76 providing a thermal link between the front and back walls. The second edge 80 is not attached to the front wall 56 so that the support member 76 will not significantly interfere with the natural expansion or contraction of the front wall 56. Leaving the second edge 80 detached from the front wall also eliminates thermal stresses in the joint between the front wall and the support member.

As is shown in FIG. 4, in this embodiment of the invention shield body 40 includes a curved portion between the planar portion in front of the exposed surface of the injector 14 and each of the upturned edges 44. Support members 76 are mounted to the back wall 58 along the curved portion of the shield body 40 for optimum effectiveness in preventing the front wall 56 from buckling. However, it should be understood that position of the support member 76 may vary in accordance with the present invention. Moreover, the number of support members 76 may be increased or decreased if desired.

Turning particularly to FIG. 5, the support members 76 of the illustrated embodiment extend longitudinally along the entire length of the shield body 40, providing the front wall 56 with a consistent amount of reinforcement across the shield body. Using one elongate support member also facilitates manufacture of the shield assembly 12. However, distributing a plurality of shorter support members 76 along the length of the shield body is within the scope of this invention. A plurality of holes or slotted openings 82 are formed in the support member 76 for the flow of the gaseous substance through the support member. Preferably, the openings 82 are configured to minimize interference with the distribution of gas throughout the plenum 60.

As is apparent from the foregoing, support members 76 reinforce the delicate front wall 56 of the shield body 40 by transmitting thermal stresses developing in the front wall to the back wall 58. Thus, the support members 76 significantly lengthen the useful life of the shield assembly 12. Although not shown in this modification of the invention, the secondary shields 46 may be provided with support members for additional stiffness if desired. In this embodiment, the front wall 56 is a perforated screen and the back wall 58, conduits 68 and baffles 70 are formed of a suitable metal such as stainless steel.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

What is claimed is:

1. A shield assembly for protecting an exposed surface of an injector, said injector including at least one injection port for delivering reactants to a reaction chamber, said shield assembly comprising:
    a shield body positionable proximate said exposed surface of said injector, said shield body having a back wall, a front wall and at least one plenum between said front wall and said back wall;
    at least one conduit coupled to said plenum for transporting a gaseous substance thereto from a gas source remote from said shield body;
    a plurality of apertures formed through said front wall of said shield body for the flow of said gaseous substance from said plenum to said reaction chamber, said apertures being configured to provide a substantially uniform distribution of said gaseous substance across an exterior region of said front wall; and
    at least one support member extending between said front wall and said back wall, said support member being positioned to transfer forces from said front wall to said back wall to thereby reinforce said front wall against collapse.

2. The shield assembly of claim 1 in which said back wall includes at least one convex curved stretch, and in which said support member is mounted to said curved stretch of said back wall.

3. The shield assembly of claim 1 in which said shield body has a planar portion parallel to said exposed surface of said injector and at least one curved portion extending upwardly from said planar portion, and in which said support member extends between said front wall and said back wall along said curved portion.

4. The shield assembly of claim 3 in which said shield body includes a second curved portion extending upwardly from said planar portion, and further comprising a second support member extending between said front wall and said back wall along said second curved portion.

5. The shield assembly of claim 1 in which said back wall is a substantially rigid plate and said front wall is a perforated screen mounted to said back wall.

6. The shield assembly of claim 1 in which said shield body includes a slot formed therethrough, said slot being configured for the substantially unobstructed passage through said shield body of said reactants injected by said injection port.

7. The shield assembly of claim 1 in which said support member includes spaced first and second edges, said first edge being mounted to said back wall of said shield body.

8. The shield assembly of claim 7 in which said second edge of said support member is positioned in contact with said front wall of said shield body.

9. The shield assembly of claim 1 in which said support member has a plurality of holes formed for the passage of said gaseous substance through said support member.

10. The shield assembly of claim 1, and further comprising a baffle positioned in said plenum for uniformly distributing said gaseous substance throughout said plenum.

11. The shield assembly of claim 1, and further comprising at least one secondary shield coupled to said shield body, said secondary shield being spaced from said shield body to define an exhaust inlet therebetween.

12. In combination, the shield assembly of claim 1 and an injector having at least one injection port and an exposed surface surrounding said injection port, said shield body covering at least a portion of said exposed surface of said injector.

13. An injection system comprising:
    an injector including at least one injection port for delivering reactants to a reaction chamber, said injector having an exposed front surface surrounding said injection port, a back surface spaced from said front surface, and side surfaces joining said front and back surfaces, and at least one injector plenum coupled to said injection port;
    a shield body mounted to said injector, said shield body covering at least a portion of said front surface and having a pair of spaced, upturned edges proximate two of said side surfaces, said shield body having a back wall, a perforated front wall, and at least one shield plenum between said back wall and said front wall;
    first and second support members extending between said front wall and said back wall, said support members each having a first edge mounted to said back wall and a second edge spaced from said first edge, said support members being configured to transfer forces from said front wall to said back wall to thereby prevent collapse of said front wall; and at least one supply conduit coupled to said shield plenum for delivering a gaseous substance to said shield plenum.

14. The injection system of claim 13 in which said upturned edges of said shield body include a curved portion, said first edge of said support members being mounted to said back wall along said curved portion of said shield body.

15. The injection system of claim 13 in which said support members include a plurality of holes formed therethrough for the passage of said gaseous substance through said support members.

16. The injection system of claim 13, and further comprising a pair of secondary shields coupled to said shield body, each of said secondary shields being positioned opposite one of said upturned edges.

* * * * *